US009881559B2

(12) United States Patent
Ma

(10) Patent No.: US 9,881,559 B2
(45) Date of Patent: Jan. 30, 2018

(54) GATE DRIVE CIRCUIT AND DISPLAY DEVICE

(71) Applicant: BOE TECHNOLOGY GROUP CO., LTD., Beijing (CN)

(72) Inventor: Zhanjie Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 194 days.

(21) Appl. No.: 14/785,297

(22) PCT Filed: Mar. 13, 2015

(86) PCT No.: PCT/CN2015/074216
§ 371 (c)(1),
(2) Date: Oct. 16, 2015

(87) PCT Pub. No.: WO2016/082374
PCT Pub. Date: Jun. 2, 2016

(65) Prior Publication Data
US 2016/0372052 A1 Dec. 22, 2016

(30) Foreign Application Priority Data

Nov. 28, 2014 (CN) .......................... 2014 1 0710699

(51) Int. Cl.
*G09G 3/3291* (2016.01)
*G09G 3/3225* (2016.01)
*G09G 3/3266* (2016.01)

(52) U.S. Cl.
CPC ......... *G09G 3/3291* (2013.01); *G09G 3/3225* (2013.01); *G09G 3/3266* (2013.01);
(Continued)

(58) Field of Classification Search
CPC .. G09G 3/3291; G09G 3/3611; G09G 3/3655; G09G 3/3674; G09G 3/3696;
(Continued)

(56) References Cited

U.S. PATENT DOCUMENTS

| 2011/0002437 A1 | 1/2011 | Su et al. |
| 2012/0169703 A1* | 7/2012 | Yang ..................... G11C 19/184 345/212 |

(Continued)

FOREIGN PATENT DOCUMENTS

| CN | 1758321 A | 4/2006 |
| CN | 101388253 | 3/2009 |

(Continued)

OTHER PUBLICATIONS

International Search Report and Written Opinion with English Language Translation, dated Aug. 14, 2015, Application No. PCT/CN2015/074216.

(Continued)

*Primary Examiner* — Nalini Mummalaneni
(74) *Attorney, Agent, or Firm* — Blakely Sokoloff Taylor & Zafman LLP

(57) ABSTRACT

An embodiment of the present invention discloses a gate drive circuit comprising several stages of unit circuits, wherein each unit circuit comprises: a high level terminal, a low level terminal, a first clock terminal, a second clock terminal, a gate output terminal, a logic turn-on input terminal, a logic turn-on output terminal, a control module, a first gating module and a second gating module. An embodiment of the present invention also provides a display device comprising the gate drive circuit. A gate drive circuit with interlaced output is realized, ensuring no suspended state in time sequence between interlaced lines, while maintaining an original dual time sequence (i.e., eliminating (Continued)

suspended state between interlaced lines, and ensuring a stable output of the shifting register).

12 Claims, 2 Drawing Sheets

(52) U.S. Cl.
CPC ............ *G09G 2310/0286* (2013.01); *G09G 2310/0289* (2013.01); *G09G 2310/08* (2013.01)

(58) Field of Classification Search
CPC ............ G09G 3/3266; G09G 3/3225; G09G 2310/0267; G09G 2310/0259; G09G 2310/067; G09G 2310/028; G09G 2310/0289; G09G 2310/0286; G09G 2310/08
See application file for complete search history.

(56) References Cited

U.S. PATENT DOCUMENTS

| | | | |
|---|---|---|---|
| 2014/0204009 A1* | 7/2014 | Kim | G09G 3/3677 345/92 |
| 2015/0043704 A1* | 2/2015 | Ma | G09G 3/3677 377/68 |

FOREIGN PATENT DOCUMENTS

| | | |
|---|---|---|
| CN | 101295546 | 10/2009 |
| CN | 101939791 A | 1/2011 |
| CN | 102654984 | 9/2012 |
| CN | 103065578 | 4/2013 |
| CN | 103106881 | 5/2013 |
| CN | 103268757 | 8/2013 |
| CN | 203118416 | 8/2013 |
| CN | 103943076 | 7/2014 |
| CN | 204242561 A * | 11/2014 |
| CN | 104332137 | 2/2015 |
| CN | 20424561 U | 4/2015 |
| CN | 204242561 | 4/2015 |
| CN | 204242561 U | 4/2015 |

OTHER PUBLICATIONS

Chinese Office Action with English Language Translation, dated Feb. 23, 2016, Chinese Application No. 201410710699.0.
Office Action in Chinese Application No. 201410710699.0 dated Jul. 5, 2016, with English translation. 9 pages.

* cited by examiner

--Prior Art--

--Prior Art--

US 9,881,559 B2

GATE DRIVE CIRCUIT AND DISPLAY DEVICE

FIELD OF THE INVENTION

The present invention relates to the technical field of display, in particular to a gate drive circuit and a display device.

BACKGROUND OF THE INVENTION

A gate signal of an existing gate drive circuit is output line by line; at present, in an OLED design, an output of the gate signal needs an interlaced output structure. Therefore, in a shifting register controlled by an existing dual clock, there is a suspended state of time sequence between line n and line n+2 (i.e., on a certain time sequence, there is no direct signal input at a level on a key circuit node, then the level on the node is in a suspended state), the output stability of the shifting register thus becomes worse.

As shown in FIG. 1, an existing shifting register structure controlled by a simple three-clock is shown; FIG. 2 shows a GOA clock time sequence for the operation thereof. The working principle of the structure is as follows; the working process of the shifting register can be divided into four parts, which can be seen in the shifting register time sequence shown in FIG. 2.

At a first phase: CLK is a low voltage turn-on signal, transistors M23 and M21 are turned on; after M23 is turned on, the low voltage signal of STV then reaches node B via M23, such that M22 is turned on, now the high voltage turn-off signal of CLKB is output to the output terminal OUT of the shifting register; at the same time the node B also controls the transistor M12, such that a high voltage VGH signal is input to the node C; after the transistor M21 is turned on, a low voltage VGL signal arrives at the node A via M21 to turn on M19; the high voltage VGH signal is also output to the output terminal OUT of the shifting register through the M19.

At a second phase: CLK is turned off; CLKB is a low voltage signal; now the low voltage signal saved in the node B also keeps M22 and M12 in an on-state. M22 is turned on such that a low voltage signal of CLKB is output to the output terminal OUT of the shifting register; M12 is turned on such that VGH is still input to the node C; while M20 controlled by CLKB is turned on, such that the VGH signal of node C is input to the node A; M19 is then in an off-state, without affecting the output terminal OUT.

At a third phase: CLK is a low voltage signal; CLKB is a high voltage signal. The low voltage signal of CLK turns on M23 and M21. After M23 is turned on, STV signal becomes high voltage and arrives at node B via M23, such that M22 and M12 are turned off; while M21 is turned on, such that VGL signal is output to the node A, turning on M19; a high voltage VGH is input to the output terminal OUT of the shifting register.

At a fourth phase: CLKB is a low voltage signal; CLK is a high voltage signal. When CLK is a high voltage signal, M21 is turned off, while CLKB turns on M20, the level of the suspended node C (i.e., the remnant of VGH of the second phase) interferes with the level of the suspended node A (i.e., the remnant of VGL of the third phase), thereby affecting the on-state of M19, and therefore affecting the signal of the output terminal OUT of the shifting register, such that the output signal is unstable.

It can be seen that if the existing shifting register is used for an interlaced output, there is a suspended state of time sequence between line n and line n+2 (i.e., on a certain time sequence, there is no direct signal input at a level on a key circuit node, then the level on the node is in a suspended state), the output stability thus becomes worse.

SUMMARY OF THE INVENTION (1) Problems to be Solved

The object of the present invention is to provide a gate drive circuit with interlaced output ensuring no suspended state in time sequence between interlaced lines.

(2) Technical Solutions

To solve the above mentioned problem, an embodiment of the present invention provides a gate drive circuit comprising several stages of unit circuits, wherein each unit circuit comprises: a high level terminal, a low level terminal, a first clock terminal, a second clock terminal, a gate output terminal, a logic turn-on input terminal, a logic turn-on output terminal, a control module, a first gating module and a second gating module; (in the context of the present invention, a unit circuit of the nth stage is used for controlling the output of the line n in the display)

the control module is connected to the high level terminal, the first clock terminal, the second clock terminal, the logic turn-on input terminal, the first gating module and the second gating module; the first gating module is connected to the low level terminal and the gate output terminal; the second gating module is connected to the low level terminal and the logic turn-on output terminal; a logic turn-on output terminal of a present unit circuit is connected with a logic turn-on input terminal of a unit circuit having an interval of one stage with the present unit circuit; the gate output terminal is connected to a gate line;

the control module is used for based on the first clock terminal, the second clock terminal, and the logic turn-on input terminal, controlling the first gating module to gate a high level signal from the high level terminal to the gate output terminal; or, gate a low level signal from the low level terminal to the gate output terminal;

the control module is also used for based on the first clock terminal, the second clock terminal, and the logic turn-on input terminal, controlling the second gating module, such that: only when the first clock terminal is in an effective time sequence state, the second gating module gates a low level signal from the low level terminal to the logic turn-on output terminal, the low level signal then being transmitted to the logic turn-on input terminal of the unit circuit having an interval of one stage with the present unit circuit, to turn on interlaced output; in other time sequence state, the second gating module gates a high level signal from the high level terminal to the logic turn-on output terminal.

Wherein the control module may comprise: a first transistor, a second transistor, a third transistor, a fourth transistor, a fifth transistor, an eighth transistor, a first capacitor and a second capacitor;

a gate of the first transistor is connected to the first clock terminal, a source of the first transistor is connected to the logic turn-on input terminal, a drain of the first transistor is connected to a gate of the third transistor;

a gate and a source of the second transistor are connected to the first clock terminal, a drain of the second transistor is connected to a source of the third transistor;

a drain of the third transistor is connected to the high level terminal;

a gate of the fourth transistor is connected to the drain of the third transistor, a source of the fourth transistor is connected to a drain of the fifth transistor, a drain of the fourth transistor is connected to the high level terminal;

a gate of the fifth transistor is connected to the drain of the first transistor, a source of the fifth transistor is connected to the second clock terminal;

a gate of the eighth transistor is connected to the second clock terminal, a source of the eighth transistor is connected to the second gating module, a drain of the eighth transistor is connected to the source of the fourth transistor;

a first terminal of the first capacitor is connected to the high level terminal, a second terminal of the first capacitor is connected to the gate of the fourth transistor;

a first terminal of the second capacitor is connected to the drain of the fifth transistor, a second terminal of the second capacitor is connected to the gate of the fifth transistor;

the first transistor is used for, under the control of the first clock terminal, transmitting the signal of the logic turn-on input terminal to the respective gates of the third transistor and the fifth transistor, and charging the second capacitor; the second transistor and the third transistor form an inverter structure, the inverter structure is used for turning the fourth transistor on or off, and charging the first capacitor; the first capacitor is used for maintaining the gate of the fourth transistor with the voltage of the first capacitor; the second capacitor is used for maintaining the gate of the third transistor and the gate of the fifth transistor respectively with the voltage of the second capacitor; the fourth transistor is used for transmitting the high level signal of the high level terminal to the first gating module when the fourth transistor is turned on; the fourth transistor is used for transmitting the signal of the high level terminal to the first gating module and the drain of the eighth transistor; the fifth transistor is used for transmitting the signal of the second clock terminal to the first gating module and the drain of the eighth transistor; the eighth transistor is used for, under the control of the second clock terminal, transmitting a signal from the fourth transistor and the fifth transistor to the second gating module.

Wherein the first gating module may comprise: a sixth transistor and a seventh transistor;

a gate of the sixth transistor is connected to the source of the fourth transistor, the source of the sixth transistor is connected to the gate output terminal, a drain of the sixth transistor is connected to the high level terminal;

a gate and a source of the seventh transistor are connected to the low level terminal, a drain of the seventh transistor is connected to the gate output terminal;

the sixth transistor is used for, under the control of a signal from the fourth transistor or fifth transistor, transmitting the signal of the high level terminal to the gate output terminal; the seventh transistor is used for transmitting the signal of the low level terminal to the gate output terminal when the sixth transistor is turned off.

Wherein the second gating module may comprise: a ninth transistor, a tenth transistor, an eleventh transistor and a third capacitor;

a gate of the ninth transistor is connected to the gate output terminal, a source of the ninth transistor is connected to a drain of the eleventh transistor, a drain of the ninth transistor is connected to the low level terminal;

a gate and a drain of the tenth transistor are connected to the logic turn-on output terminal, a source of the tenth transistor is connected to the high level terminal;

a gate of the eleventh transistor is connected to the source of the eighth transistor, a source of the eleventh transistor is connected to the logic turn-on output terminal, a drain of the eleventh transistor is connected to the source of the ninth transistor;

a first terminal of the third capacitor is connected to the gate of the eleventh transistor, a second terminal of the third capacitor is connected to the logic turn-on output terminal;

the eighth transistor is also used for transmitting a signal from the fourth transistor and the fifth transistor to the third capacitor, to charge the third capacitor; the third capacitor is used for maintaining the gate of the eleventh transistor with the voltage of the third capacitor; only when the first clock terminal is in an effective time sequence state, the ninth transistor and the eleventh transistor are used for transmitting the signal of the low level terminal to the logic turn-on output terminal; in other time sequence state, the tenth transistor is used for transmitting a signal from the high level terminal to the logic turn-on output terminal.

An embodiment of the present invention also provides a display device, wherein the display device comprises a gate drive circuit according to any one of the above mentioned embodiments.

(3) Beneficial Effects

The solutions provided by the present invention turn on the unit circuits (shifting registers) with a interval of one line, thereby realizing a gate drive circuit with interlaced output ensuring no suspended state in time sequence between interlaced lines, while maintaining an original dual time sequence (i.e., eliminating suspended state between interlaced lines, and ensuring a stable output of the shifting register).

DETAILED DESCRIPTION OF THE INVENTION

In the following, the technical solutions in embodiments of the invention will be described clearly and completely in connection with the drawings in the embodiments of the invention. The following embodiments are used for illustrating the present invention, rather than limiting the scope of the present invention.

Figure 1:
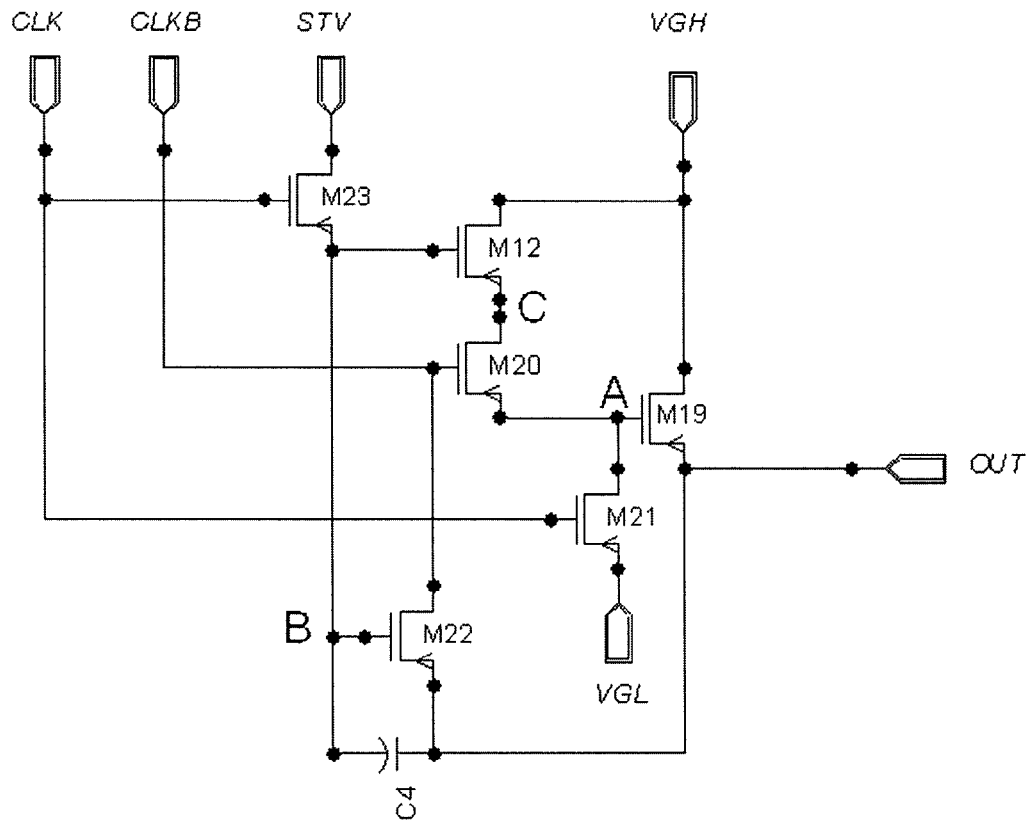
FIG. 1 is a structural schematic diagram of a unit circuit in a gate drive circuit in the prior art.
Figure 2:
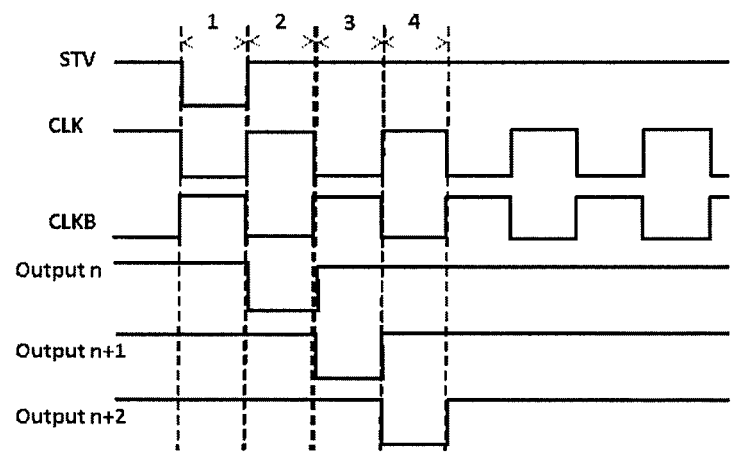
FIG. 2 is a time sequence diagram of the input signal and output signal in the circuit of FIG. 1.
Figure 3:
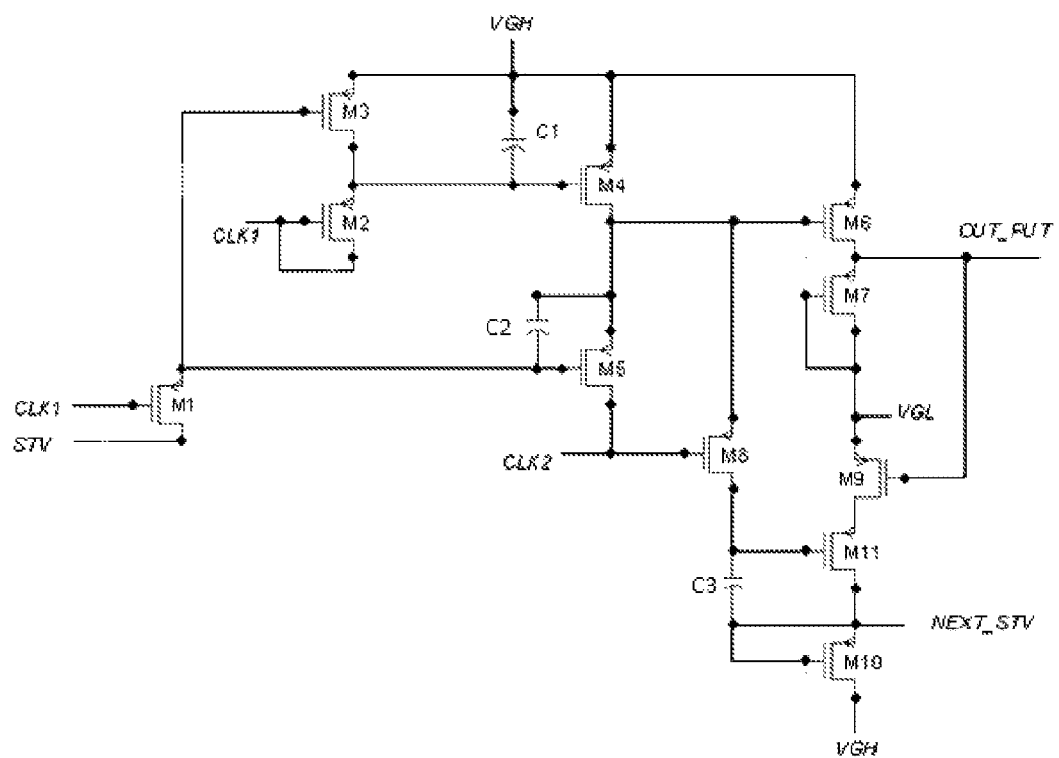
FIG. 3 is a structural schematic diagram of a unit circuit in a gate drive circuit according to an embodiment of the present invention.

An embodiment of the present invention provides a gate drive circuit comprising several stages of unit circuits (i.e., shifting registers), one of which is shown in FIG. 3; wherein each unit circuit comprises: a high level terminal VGH, a low level terminal VGL, a first clock terminal CLK1, a second clock terminal CLK2, a gate output terminal OUT_TPUT, a logic turn-on input terminal STV, a logic turn-on output terminal NEXT_STV, a control module, a first gating module and a second gating module.

The control module is connected to the high level terminal VGH, the first clock terminal CLK1, the second clock terminal CLK2, the logic turn-on input terminal STV, the first gating module and the second gating module; the first gating module is connected to the low level terminal VGL and the gate output terminal OUT_PUT; the second gating module is connected to the low level terminal VGL and the logic turn-on output terminal NEXT_STV; a logic turn-on output terminal NEXT_STV of a present unit circuit (e.g., the nth stage) is connected with a logic turn-on input terminal STV of a unit circuit (e.g., the n+2th stage) having an interval of one stage with the present unit circuit; the gate output terminal OUT_PUT is connected to a gate line; wherein the logic turn-on input terminal STV of the first stage unit circuit is connected to a signal source terminal of logic turn-on.

The control module is used for based on the first clock terminal CLK1, the second clock terminal CLK2, and the logic turn-on input terminal STV, controlling the first gating module to gate a high level signal from the high level terminal VGH to the gate output terminal OUT_PUT; or, gate a low level signal from the low level terminal VGL to the gate output terminal OUT_PUT.

The control module is also used for based on the first clock terminal CLK1, the second clock terminal CLK2, and the logic turn-on input terminal STV, controlling the second gating module, such that: only when the first clock terminal CLK1 is in an effective time sequence state, the second gating module gates a low level signal from the low level terminal VGL to the logic turn-on output terminal NEXT_STV, the low level signal then being transmitted to the logic turn-on input terminal STV of the unit circuit having an interval of one stage with the present unit circuit, to turn on interlaced output; in other time sequence state, the second gating module gates a high level signal from the high level terminal VGH to the logic turn-on output terminal NEXT_STV.

In the embodiment, the control module comprises: a first transistor M1, a second transistor M2, a third transistor M3, a fourth transistor M4, a fifth transistor M5, an eighth transistor M8, a first capacitor C1 and a second capacitor C2.

A gate of the first transistor M1 is connected to the first clock terminal CLK1, a source of the first transistor M1 is connected to the logic turn-on input terminal STV, a drain of the first transistor M1 is connected to a gate of the third transistor M3.

A gate and a source of the second transistor M2 are connected to the first clock terminal CLK1, a drain of the second transistor M2 is connected to a source of the third transistor M3.

A drain of the third transistor M3 is connected to the high level terminal VGH.

A gate of the fourth transistor M4 is connected to the drain of the third transistor M3, a source of the fourth transistor M4 is connected to a drain of the fifth transistor M5, a drain of the fourth transistor M4 is connected to the high level terminal VGH.

A gate of the fifth transistor M5 is connected to the drain of the first transistor M1, a source of the fifth transistor M5 is connected to the second clock terminal CLK2.

A gate of the eighth transistor M8 is connected to the second clock terminal CLK2, a source of the eighth transistor M8 is connected to the second gating module, a drain of the eighth transistor M8 is connected to the source of the fourth transistor M4.

A first terminal of the first capacitor C1 is connected to the high level terminal VGH, a second terminal of the first capacitor C1 is connected to the gate of the fourth transistor M4.

A first terminal of the second capacitor C2 is connected to the drain of the fifth transistor M5, a second terminal of the second capacitor C2 is connected to the gate of the fifth transistor M5.

The first transistor M1 is used for, under the control of the first clock terminal CLK1, transmitting the signal of the logic turn-on input terminal STV to the respective gates of the third transistor M3 and the fifth transistor M5, and charging the second capacitor C2; the second transistor M2 and the third transistor M3 form an inverter structure, the inverter structure is used for turning the fourth transistor M4 on or off, and charging the first capacitor C1; the first capacitor C1 is used for maintaining the gate of the fourth transistor M4 with the voltage of the first capacitor C1; the second capacitor C2 is used for maintaining the gate of the third transistor M3 and the gate of the fifth transistor M5 respectively with the voltage of the second capacitor C2; the fourth transistor M4 is used for transmitting the high level signal of the high level terminal VGH to the first gating module when the fourth transistor M4 is turned on; the fourth transistor M4 is used for transmitting the signal of the high level terminal VGH to the first gating module and the drain of the eighth transistor M8; the fifth transistor M5 is used for transmitting the signal of the second clock terminal CLK2 to the first gating module and the drain of the eighth transistor M8; the eighth transistor M8 is used for, under the control of the second clock terminal CLK2, transmitting a signal from the fourth transistor M4 and the fifth transistor M5 to the second gating module.

In the embodiment, the first gating module comprises: a sixth transistor M6 and a seventh transistor M7.

A gate of the sixth transistor M6 is connected to the source of the fourth transistor M4, the source of the sixth transistor M6 is connected to the gate output terminal OUT_PUT, a drain of the sixth transistor M6 is connected to the high level terminal VGH.

A gate and a source of the seventh transistor M7 are connected to the low level terminal VGL, a drain of the seventh transistor M7 is connected to the gate output terminal OUT_PUT.

The sixth transistor M6 is used for, under the control of a signal from the fourth transistor M4 or fifth transistor M5, transmitting the signal of the high level terminal VGH to the gate output terminal OUT_PUT; the seventh transistor M7 is used for transmitting the signal of the low level terminal VGL to the gate output terminal OUT_PUT when the sixth transistor M6 is turned off.

In the embodiment, the second gating module comprises: a ninth transistor M9, a tenth transistor M10, an eleventh transistor M11 and a third capacitor C3.

A gate of the ninth transistor M9 is connected to the gate output terminal OUT_PUT, a source of the ninth transistor M9 is connected to a drain of the eleventh transistor M11, a drain of the ninth transistor M9 is connected to the low level terminal VGL.

A gate and a drain of the tenth transistor M10 are connected to the logic turn-on output terminal NEXT_STV, a source of the tenth transistor M10 is connected to the high level terminal VGH.

A gate of the eleventh transistor M11 is connected to the source of the eighth transistor M8, a source of the eleventh transistor M11 is connected to the logic turn-on output terminal NEXT_STV, a drain of the eleventh transistor M11 is connected to the source of the ninth transistor M9.

A first terminal of the third capacitor C3 is connected to the gate of the eleventh transistor M11, a second terminal of the third capacitor C3 is connected to the logic turn-on output terminal NEXT_STV.

The eighth transistor M8 is also used for transmitting a signal from the fourth transistor M4 and the fifth transistor M5 to the third capacitor C3, to charge the third capacitor C3; the third capacitor C3 is used for maintaining the gate of the eleventh transistor M11 with the voltage of the third capacitor C3; only when the first clock terminal is in an effective time sequence state, the ninth transistor M9 and the eleventh transistor M11 are used for transmitting the signal of the low level terminal VGL to the logic turn-on output terminal NEXT_STV; in other time sequence state, the tenth transistor M10 is used for transmitting a signal from the high level terminal VGH to the logic turn-on output terminal NEXT_STV.

Figure 4:
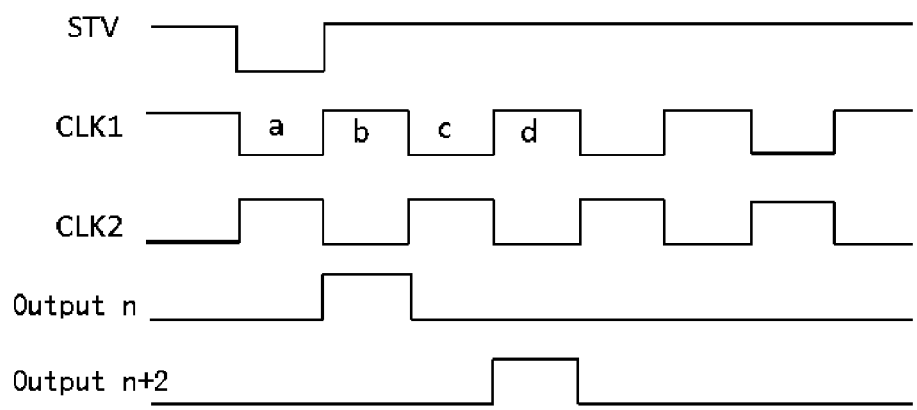
FIG. 4 is a time sequence diagram of the input signal and output signal in the circuit of FIG. 3.

FIG. 4 shows a time sequence diagram of the gate drive circuit in the embodiment of the present invention, wherein the turn-on signal for the gates of respective transistors is a low level signal (i.e., low level effective), and the turn-off signal is a high level signal; the working principle of the circuit is as follows.

At a first phase: CLK1 and STV provide turn-on signals; CLK2 provides a turn-off signal. When CLK1 provides a turn-on signal, the transistor M1 is turned on, and the turn-on signal of STV is transmitted to the gates of the transistors M3 and M5 respectively, allowing M3 and M5 to be turned on; the capacitor C2 is charged and maintained. Since M3 is turned on, the inverter (formed by M2 and M3) transmits the VGH signal to the gate of the transistor M4, turning off the transistor M4. Meanwhile, since M5 is turned on, the turn-off signal of CLK2 is transmitted to the gate of M6; then in the inverter formed by M6 and M7, the low level signal is transmitted to OUT_PUT through the transistor M7 and output to a gate line connected with the OUT_PUT. Meanwhile, since CLK2 provides a turn-off signal, the transistor M8 is turned off, in the inverter structure formed by the transistors M10 and M11 (i.e., when M11 is in an off-state, M10 is kept in an on-state, the output is a high level turn-off signal, so as to ensure that the NEXT_STV of only one line is a low level, and the rest are high level output), a high level turn-off signal is transmitted through the transistor M10 to the terminal NEXT_STV, wherein the signal terminal NEXT_STV is an STV terminal of a shifting register having an interval of one stage with the present unit circuit.

At a second phase: CLK2 provides a turn-on signal; CLK1 and STV provide turn-off signals. At the gates of the transistors M3 and M5, a low level turn-on signal is still maintained (as in the first phase) with the capacitor C2. Since M3 is turned on, in the inverter formed by M2 and M3, the VGH signal is transmitted to the gate of the transistor M4 through M3 to turn off M4, moreover, the capacitor C1 is charged and maintains the gate of the transistor M4. Since the transistor M5 is turned on, the low level signal of CLK2 is transmitted to the gate of the transistor M6; M6 is turned on, then in the inverter formed by M6 and M7, the VGH signal is transmitted to OUT_PUT through M6 and output. Meanwhile, the transistor M8 controlled by CLK2 is turned on, the low level signal of CLK2 (which passes through M5) is input to the gate of the transistor M11 through M8, charging and maintaining the capacitor C3. In the gating device formed by M9, M10 and M11, since a turn-off signal is on the gate of M9, the gating device transmits the VGH high level signal (which passes through M10) to NEXT_STV.

At a third phase: CLK1 provides a turn-on signal; CLK2 and STV provide turn-off signals. When CLK1 provides a turn-on signal, the transistor M1 is turned on, the turn-off signal of STV is transmitted to the gates of the transistors M3 and M5; the capacitor C2 is charged. The turn-off signal STV turns off the transistors M3 and M5. In the inverter formed by the transistors M2 and M3, the low level signal (which passes through M2) is transmitted to the gate of the transistor M4, maintained by the capacitor C1. This signal turns on the transistor M4, transmits the VGH signal to the gate of the transistor M6; then in the inverter structure formed by the transistors M6 and M7, the low level signal (which passes through M7) is transmitted to OUT_PUT and output. Since CLK2 is a turn-off signal, the transistor M8 is in an off-state. In the gating device formed by the transistors M9, M10 and M11, the low level signal of the second phase is maintained (with the capacitor C3) as the gate signal of M11, the transistor M11 is turned on; meanwhile, the terminal OUT_PUT connected with the gate of M9 is provided with a low level signal, M9 is turned on. Therefore, M9 and M11 in the gating device are turned on simultaneously; the low level signal of VGL is transmitted to NEXT_STV. In such a manner, the NEXT_STV signal output simultaneously with CLK2 in the existing circuit, is then turned into the NEXT_STV signal controlled by an interlaced CLK1, realizing the precondition of interlaced output.

At a fourth phase: CLK2 provides a turn-on signal; CLK1 and STV provide turn-off signals. The high level signal of the third phase are still maintained on the gates of the transistors M3 and M5 by the capacitor C2, then M3 and M5 are turned off. The low level maintained by C1 in the third phase turns on M4; M4 transmits the VGH signal to the gate of M6; therefore, in the inverter formed by M6 and M7, the low level signal (which passes M7) is transmitted to OUT_PUT and output. Meanwhile, the transistor M8 controlled by CLK2 is turned on; the VGH signal (which passes through M4) is transmitted to the gate of M11, charging and maintaining the capacitor C3. In such a manner, in the structure of the gating device M9, M10 and M11, since M11 is turned off, the high level signal (which passes through M10) is transmitted to NEXT_STV.

In this way, in the rest of the time sequence, since the gate of the transistor M6 is always provided with a turn-off signal, it is ensured that the gating device (M9, M10 and M11) still outputs a high level signal to NEXT_STV, ensuring the output of the interlaced signal.

The solutions provided by the present invention turn on the unit circuits (shifting registers) with a interval of one line, thereby realizing a gate drive circuit with interlaced output ensuring no suspended state in time sequence between interlaced lines, while maintaining an original dual time sequence (i.e., eliminating suspended state between interlaced lines, and ensuring a stable output of the shifting register). From the above mentioned working principle, it can be seen that there is no suspended state in time sequence between line n and line n+2 (the output of line n in FIG. 4 is the output of the terminal OUT_PUT of the unit circuit in FIG. 3; the output of line n+2 in FIG. 4 is the output of the terminal OUT_PUT of a shifting register having an interval of one line with the unit circuit in FIG. 3).

An embodiment of the present invention also provides a display device, wherein the display device comprises a gate drive circuit according to any one of the above mentioned embodiments. The display device can be any product or component with display function, such as OLED panel, mobile phone, tablet computer, TV, display, notebook computer, digital photo frame, navigator and so on.

The above embodiments are only used for explanations rather than limitations to the present invention, the ordinary skilled person in the related technical field, in the case of not departing from the spirit and scope of the present invention, may also make various modifications and variations, therefore, all the equivalent solutions also belong to the scope of the present invention, the patent protection scope of the present invention should be defined by the claims.

The invention claimed is:

1. A gate drive circuit comprising several stages of unit circuits, wherein each unit circuit comprises: a high level terminal, a low level terminal, a first clock terminal, a second clock terminal, a gate output terminal, a logic turn-on input terminal, a logic turn-on output terminal, a control module, a first gating module and a second gating module;

the control module is connected to the high level terminal, the first clock terminal, the second clock terminal, the logic turn-on input terminal, the first gating module and the second gating module; the first gating module is connected to the low level terminal and the gate output terminal; the second gating module is connected to the low level terminal and the logic turn-on output terminal; a logic turn-on output terminal of a present unit circuit is connected with a logic turn-on input terminal of a unit circuit having an interval of one stage with the present unit circuit; the gate output terminal is connected to a gate line;

the control module is used for based on the first clock terminal, the second clock terminal, and the logic turn-on input terminal, controlling the first gating module to gate a high level signal from the high level terminal to the gate output terminal; or, gate a low level signal from the low level terminal to the gate output terminal;

the control module is also used for based on the first clock terminal, the second clock terminal, and the logic turn-on input terminal, controlling the second gating module, such that: only when the first clock terminal is in an effective time sequence state, the second gating module gates a low level signal from the low level terminal to the logic turn-on output terminal, the low level signal then being transmitted to the logic turn-on input terminal of the unit circuit having an interval of one stage with the present unit circuit, to turn on interlaced output; in other time sequence state, the second gating module gates a high level signal from the high level terminal to the logic turn-on output terminal.

2. The gate drive circuit according to claim 1, wherein the control module comprises: a first transistor, a second transistor, a third transistor, a fourth transistor, a fifth transistor, an eighth transistor, a first capacitor and a second capacitor;

a gate of the first transistor is connected to the first clock terminal, a source of the first transistor is connected to the logic turn-on input terminal, a drain of the first transistor is connected to a gate of the third transistor;

a gate and a source of the second transistor are connected to the first clock terminal, a drain of the second transistor is connected to a source of the third transistor;

a drain of the third transistor is connected to the high level terminal;

a gate of the fourth transistor is connected to the drain of the third transistor, a source of the fourth transistor is connected to a drain of the fifth transistor, a drain of the fourth transistor is connected to the high level terminal;

a gate of the fifth transistor is connected to the drain of the first transistor, a source of the fifth transistor is connected to the second clock terminal;

a gate of the eighth transistor is connected to the second clock terminal, a source of the eighth transistor is connected to the second gating module, a drain of the eighth transistor is connected to the source of the fourth transistor;

a first terminal of the first capacitor is connected to the high level terminal, a second terminal of the first capacitor is connected to the gate of the fourth transistor;

a first terminal of the second capacitor is connected to the drain of the fifth transistor, a second terminal of the second capacitor is connected to the gate of the fifth transistor;

the first transistor is used for, under the control of the first clock terminal, transmitting the signal of the logic turn-on input terminal to the respective gates of the third transistor and the fifth transistor, and charging the second capacitor; the second transistor and the third transistor form an inverter structure, the inverter structure is used for turning the fourth transistor on or off, and charging the first capacitor; the first capacitor is used for maintaining the gate of the fourth transistor with the voltage of the first capacitor; the second capacitor is used for maintaining the gate of the third transistor and the gate of the fifth transistor respectively with the voltage of the second capacitor; the fourth transistor is used for transmitting the high level signal of the high level terminal to the first gating module when the fourth transistor is turned on; the fourth transistor is used for transmitting the signal of the high level terminal to the first gating module and the drain of the eighth transistor; the fifth transistor is used for transmitting the signal of the second clock terminal to the first gating module and the drain of the eighth transistor; the eighth transistor is used for, under the control of the second clock terminal, transmitting a signal from the fourth transistor and the fifth transistor to the second gating module.

3. The gate drive circuit according to claim 2, wherein the first gating module comprises: a sixth transistor and a seventh transistor;

a gate of the sixth transistor is connected to the source of the fourth transistor, the source of the sixth transistor is connected to the gate output terminal, a drain of the sixth transistor is connected to the high level terminal;

a gate and a source of the seventh transistor are connected to the low level terminal, a drain of the seventh transistor is connected to the gate output terminal;

the sixth transistor is used for, under the control of a signal from the fourth transistor or fifth transistor, transmitting the signal of the high level terminal to the gate output terminal; the seventh transistor is used for transmitting the signal of the low level terminal to the gate output terminal when the sixth transistor is turned off.

4. The gate drive circuit according to claim 2, wherein the second gating module comprises: a ninth transistor, a tenth transistor, an eleventh transistor and a third capacitor;

a gate of the ninth transistor is connected to the gate output terminal, a source of the ninth transistor is connected to a drain of the eleventh transistor, a drain of the ninth transistor is connected to the low level terminal;

a gate and a drain of the tenth transistor are connected to the logic turn-on output terminal, a source of the tenth transistor is connected to the high level terminal;

a gate of the eleventh transistor is connected to the source of the eighth transistor, a source of the eleventh transistor is connected to the logic turn-on output terminal, a drain of the eleventh transistor is connected to the source of the ninth transistor;

a first terminal of the third capacitor is connected to the gate of the eleventh transistor, a second terminal of the third capacitor is connected to the logic turn-on output terminal;

the eighth transistor is also used for transmitting a signal from the fourth transistor and the fifth transistor to the third capacitor, to charge the third capacitor; the third capacitor is used for maintaining the gate of the eleventh transistor with the voltage of the third capacitor; only when the first clock terminal is in an effective time sequence state, the ninth transistor and the eleventh transistor are used for transmitting the signal of the low level terminal to the logic turn-on output terminal; in other time sequence state, the tenth transistor is used for transmitting a signal from the high level terminal to the logic turn-on output terminal.

5. A display device, wherein the display device comprises a gate drive circuit, the gate drive circuit comprises several stages of unit circuits, wherein each unit circuit comprises: a high level terminal, a low level terminal, a first clock terminal, a second clock terminal, a gate output terminal, a logic turn-on input terminal, a logic turn-on output terminal, a control module, a first gating module and a second gating module;

the control module is connected to the high level terminal, the first clock terminal, the second clock terminal, the logic turn-on input terminal, the first gating module and the second gating module; the first gating module is connected to the low level terminal and the gate output terminal; the second gating module is connected to the low level terminal and the logic turn-on output terminal; a logic turn-on output terminal of a present unit circuit is connected with a logic turn-on input terminal of a unit circuit having an interval of one stage with the present unit circuit; the gate output terminal is connected to a gate line;

the control module is used for based on the first clock terminal, the second clock terminal, and the logic turn-on input terminal, controlling the first gating module to gate a high level signal from the high level terminal to the gate output terminal; or, gate a low level signal from the low level terminal to the gate output terminal;

the control module is also used for based on the first clock terminal, the second clock terminal, and the logic turn-on input terminal, controlling the second gating module, such that: only when the first clock terminal is in an effective time sequence state, the second gating module gates a low level signal from the low level terminal to the logic turn-on output terminal, the low level signal then being transmitted to the logic turn-on input terminal of the unit circuit having an interval of one stage with the present unit circuit, to turn on interlaced output; in other time sequence state, the second gating module gates a high level signal from the high level terminal to the logic turn-on output terminal.

6. The display device according to claim 5, wherein the control module comprises: a first transistor, a second transistor, a third transistor, a fourth transistor, a fifth transistor, an eighth transistor, a first capacitor and a second capacitor;

a gate of the first transistor is connected to the first clock terminal, a source of the first transistor is connected to the logic turn-on input terminal, a drain of the first transistor is connected to a gate of the third transistor;

a gate and a source of the second transistor are connected to the first clock terminal, a drain of the second transistor is connected to a source of the third transistor;

a drain of the third transistor is connected to the high level terminal;

a gate of the fourth transistor is connected to the drain of the third transistor, a source of the fourth transistor is connected to a drain of the fifth transistor, a drain of the fourth transistor is connected to the high level terminal;

a gate of the fifth transistor is connected to the drain of the first transistor, a source of the fifth transistor is connected to the second clock terminal;

a gate of the eighth transistor is connected to the second clock terminal, a source of the eighth transistor is connected to the second gating module, a drain of the eighth transistor is connected to the source of the fourth transistor;

a first terminal of the first capacitor is connected to the high level terminal, a second terminal of the first capacitor is connected to the gate of the fourth transistor;

a first terminal of the second capacitor is connected to the drain of the fifth transistor, a second terminal of the second capacitor is connected to the gate of the fifth transistor;

the first transistor is used for, under the control of the first clock terminal, transmitting the signal of the logic turn-on input terminal to the respective gates of the third transistor and the fifth transistor, and charging the second capacitor; the second transistor and the third transistor form an inverter structure, the inverter structure is used for turning the fourth transistor on or off, and charging the first capacitor; the first capacitor is used for maintaining the gate of the fourth transistor with the voltage of the first capacitor; the second capacitor is used for maintaining the gate of the third transistor and the gate of the fifth transistor respectively with the voltage of the second capacitor; the fourth transistor is used for transmitting the high level signal of the high level terminal to the first gating module when the fourth transistor is turned on; the fourth transistor is used for transmitting the signal of the high level terminal to the first gating module and the drain of the eighth transistor; the fifth transistor is used for transmitting the signal of the second clock terminal to the first gating module and the drain of the eighth transistor; the eighth transistor is used for, under the control of the second clock terminal, transmitting a signal from the fourth transistor and the fifth transistor to the second gating module.

7. The display device according to claim 6, wherein the first gating module comprises: a sixth transistor and a seventh transistor;

a gate of the sixth transistor is connected to the source of the fourth transistor, the source of the sixth transistor is connected to the gate output terminal, a drain of the sixth transistor is connected to the high level terminal;

a gate and a source of the seventh transistor are connected to the low level terminal, a drain of the seventh transistor is connected to the gate output terminal;

the sixth transistor is used for, under the control of a signal from the fourth transistor or fifth transistor, transmitting the signal of the high level terminal to the gate output terminal; the seventh transistor is used for transmitting the signal of the low level terminal to the gate output terminal when the sixth transistor is turned off.

8. The display device according to claim 6, wherein the second gating module comprises: a ninth transistor, a tenth transistor, an eleventh transistor and a third capacitor;
- a gate of the ninth transistor is connected to the gate output terminal, a source of the ninth transistor is connected to a drain of the eleventh transistor, a drain of the ninth transistor is connected to the low level terminal;
- a gate and a drain of the tenth transistor are connected to the logic turn-on output terminal, a source of the tenth transistor is connected to the high level terminal;
- a gate of the eleventh transistor is connected to the source of the eighth transistor, a source of the eleventh transistor is connected to the logic turn-on output terminal, a drain of the eleventh transistor is connected to the source of the ninth transistor;
- a first terminal of the third capacitor is connected to the gate of the eleventh transistor, a second terminal of the third capacitor is connected to the logic turn-on output terminal;
- the eighth transistor is also used for transmitting a signal from the fourth transistor and the fifth transistor to the third capacitor, to charge the third capacitor; the third capacitor is used for maintaining the gate of the eleventh transistor with the voltage of the third capacitor; only when the first clock terminal is in an effective time sequence state, the ninth transistor and the eleventh transistor are used for transmitting the signal of the low level terminal to the logic turn-on output terminal; in other time sequence state, the tenth transistor is used for transmitting a signal from the high level terminal to the logic turn-on output terminal.

9. A display panel comprising a gate drive circuit comprising several stages of unit circuits, wherein each unit circuit comprises: a high level terminal, a low level terminal, a first clock terminal, a second clock terminal, a gate output terminal, a logic turn-on input terminal, a logic turn-on output terminal, a control module, a first gating module and a second gating module;
- the control module is connected to the high level terminal, the first clock terminal, the second clock terminal, the logic turn-on input terminal, the first gating module and the second gating module; the first gating module is connected to the low level terminal and the gate output terminal; the second gating module is connected to the low level terminal and the logic turn-on output terminal; a logic turn-on output terminal of a present unit circuit is connected with a logic turn-on input terminal of a unit circuit having an interval of one stage with the present unit circuit; the gate output terminal is connected to a gate line;
- the control module is used for based on the first clock terminal, the second clock terminal, and the logic turn-on input terminal, controlling the first gating module to gate a high level signal from the high level terminal to the gate output terminal; or, gate a low level signal from the low level terminal to the gate output terminal;
- the control module is also used for based on the first clock terminal, the second clock terminal, and the logic turn-on input terminal, controlling the second gating module, such that: only when the first clock terminal is in an effective time sequence state, the second gating module gates a low level signal from the low level terminal to the logic turn-on output terminal, the low level signal then being transmitted to the logic turn-on input terminal of the unit circuit having an interval of one stage with the present unit circuit, to turn on interlaced output; in other time sequence state, the second gating module gates a high level signal from the high level terminal to the logic turn-on output terminal.

10. The display panel according to claim 9, wherein the control module comprises: a first transistor, a second transistor, a third transistor, a fourth transistor, a fifth transistor, an eighth transistor, a first capacitor and a second capacitor;
- a gate of the first transistor is connected to the first clock terminal, a source of the first transistor is connected to the logic turn-on input terminal, a drain of the first transistor is connected to a gate of the third transistor;
- a gate and a source of the second transistor are connected to the first clock terminal, a drain of the second transistor is connected to a source of the third transistor;
- a drain of the third transistor is connected to the high level terminal;
- a gate of the fourth transistor is connected to the drain of the third transistor, a source of the fourth transistor is connected to a drain of the fifth transistor, a drain of the fourth transistor is connected to the high level terminal;
- a gate of the fifth transistor is connected to the drain of the first transistor, a source of the fifth transistor is connected to the second clock terminal;
- a gate of the eighth transistor is connected to the second clock terminal, a source of the eighth transistor is connected to the second gating module, a drain of the eighth transistor is connected to the source of the fourth transistor;
- a first terminal of the first capacitor is connected to the high level terminal, a second terminal of the first capacitor is connected to the gate of the fourth transistor;
- a first terminal of the second capacitor is connected to the drain of the fifth transistor, a second terminal of the second capacitor is connected to the gate of the fifth transistor;
- the first transistor is used for, under the control of the first clock terminal, transmitting the signal of the logic turn-on input terminal to the respective gates of the third transistor and the fifth transistor, and charging the second capacitor; the second transistor and the third transistor form an inverter structure, the inverter structure is used for turning the fourth transistor on or off, and charging the first capacitor; the first capacitor is used for maintaining the gate of the fourth transistor with the voltage of the first capacitor; the second capacitor is used for maintaining the gate of the third transistor and the gate of the fifth transistor respectively with the voltage of the second capacitor; the fourth transistor is used for transmitting the high level signal of the high level terminal to the first gating module when the fourth transistor is turned on; the fourth transistor is used for transmitting the signal of the high level terminal to the first gating module and the drain of the eighth transistor; the fifth transistor is used for transmitting the signal of the second clock terminal to the first gating module and the drain of the eighth transistor; the eighth transistor is used for, under the control of the second clock terminal, transmitting a signal from the fourth transistor and the fifth transistor to the second gating module.

11. The display panel according to claim 10, wherein the first gating module comprises: a sixth transistor and a seventh transistor;

a gate of the sixth transistor is connected to the source of the fourth transistor, the source of the sixth transistor is connected to the gate output terminal, a drain of the sixth transistor is connected to the high level terminal;

a gate and a source of the seventh transistor are connected to the low level terminal, a drain of the seventh transistor is connected to the gate output terminal;

the sixth transistor is used for, under the control of a signal from the fourth transistor or fifth transistor, transmitting the signal of the high level terminal to the gate output terminal; the seventh transistor is used for transmitting the signal of the low level terminal to the gate output terminal when the sixth transistor is turned off.

12. The display panel according to claim 10, wherein the second gating module comprises: a ninth transistor, a tenth transistor, an eleventh transistor and a third capacitor;

a gate of the ninth transistor is connected to the gate output terminal, a source of the ninth transistor is connected to a drain of the eleventh transistor, a drain of the ninth transistor is connected to the low level terminal;

a gate and a drain of the tenth transistor are connected to the logic turn-on output terminal, a source of the tenth transistor is connected to the high level terminal;

a gate of the eleventh transistor is connected to the source of the eighth transistor, a source of the eleventh transistor is connected to the logic turn-on output terminal, a drain of the eleventh transistor is connected to the source of the ninth transistor;

a first terminal of the third capacitor is connected to the gate of the eleventh transistor, a second terminal of the third capacitor is connected to the logic turn-on output terminal;

the eighth transistor is also used for transmitting a signal from the fourth transistor and the fifth transistor to the third capacitor, to charge the third capacitor; the third capacitor is used for maintaining the gate of the eleventh transistor with the voltage of the third capacitor; only when the first clock terminal is in an effective time sequence state, the ninth transistor and the eleventh transistor are used for transmitting the signal of the low level terminal to the logic turn-on output terminal; in other time sequence state, the tenth transistor is used for transmitting a signal from the high level terminal to the logic turn-on output terminal.

* * * * *